United States Patent
Yuan et al.

(10) Patent No.: US 11,022,632 B2
(45) Date of Patent: Jun. 1, 2021

(54) ELECTRIC CURRENT SENSOR

(71) Applicants: Fu-Te Yuan, New Taipei (TW); Yen-Chi Lee, New Taipei (TW)

(72) Inventors: Fu-Te Yuan, New Taipei (TW); Yen-Chi Lee, New Taipei (TW)

(73) Assignee: iSentek Inc., New Taipei (TW)

( * ) Notice: Subject to any disclaimer, the term of this patent is extended or adjusted under 35 U.S.C. 154(b) by 0 days.

(21) Appl. No.: 16/547,604

(22) Filed: Aug. 22, 2019

(65) Prior Publication Data

US 2020/0064379 A1 Feb. 27, 2020

Related U.S. Application Data

(60) Provisional application No. 62/720,932, filed on Aug. 22, 2018.

(30) Foreign Application Priority Data

May 30, 2019 (TW) .................. 108118714

(51) Int. Cl.
*G01R 15/20* (2006.01)

(52) U.S. Cl.
CPC .................. *G01R 15/205* (2013.01)

(58) Field of Classification Search
CPC .............. G01R 33/0011; G01R 33/093; G01R 33/098; G01R 15/185; G01R 15/205; G01R 17/10; G01R 17/105; G01R 33/0005; G01R 33/0023; G01R 33/0094; G01R 33/09; G01R 33/091
See application file for complete search history.

(56) References Cited

U.S. PATENT DOCUMENTS 7,126,330 B2 10/2006 Peczalski et al.
8,823,361 B2 9/2014 Yao et al.
(Continued)

FOREIGN PATENT DOCUMENTS

CN 102809682 12/2012
CN 105571618 5/2016
(Continued)

OTHER PUBLICATIONS

"Office Action of Taiwan Counterpart Application", dated Apr. 27, 2020, p. 1-p. 5.

*Primary Examiner* — Huy Q Phan
*Assistant Examiner* — Adam S Clarke
(74) *Attorney, Agent, or Firm* — JCIPRNET

(57) ABSTRACT

An electric current sensor includes a substrate, a first sloped surface, a second sloped surface, at least one conductive wire, a first anisotropic magnetoresistor (AMR) unit, a second AMR unit, a first magnetization direction setting device, and a second magnetization direction setting device. The first sloped surface and the second sloped surface are disposed on the substrate and arranged in a first direction. The at least one conductive wire extends along a second direction and is disposed beside the substrate. The first AMR unit is disposed on the first sloped surface. The second AMR unit is disposed on the second sloped surface. The first magnetization direction setting device and the second magnetization direction setting device are configured to set magnetization directions of the AMR units.

14 Claims, 9 Drawing Sheets

(56) References Cited

U.S. PATENT DOCUMENTS

2013/0320972 A1* 12/2013 Loreit .................. G01R 33/093
                                                          324/252
2015/0108974 A1*  4/2015 Kennedy ............. G01R 33/098
                                                          324/252
2015/0285873 A1* 10/2015 Cai ....................... G01R 33/00
                                                          324/252

FOREIGN PATENT DOCUMENTS

| TW | 331592    | 5/1998  |
| TW | 201213833 | 4/2012  |
| TW | 201423136 | 6/2014  |
| TW | 201640134 | 11/2016 |
| TW | 201818050 | 5/2018  |
| WO | 2010041221 | 4/2010 |

* cited by examiner

# ELECTRIC CURRENT SENSOR

CROSS-REFERENCE TO RELATED APPLICATION

This application claims the priority benefits of U.S. provisional application Ser. No. 62/720,932, filed on Aug. 22, 2018, and Taiwan application serial no. 108118714, filed on May 30, 2019. The entirety of each of the above-mentioned patent applications is hereby incorporated by reference herein and made a part of this specification.

BACKGROUND

Technical Field

The disclosure relates to a sensor; more particularly, the disclosure relates to an electric current sensor.

Description of Related Art

An electric current sensing operation is one of the indispensable factors in industrial automation. In recent years, the demand for the electric current sensing operation has been expanded from industrial use to consumer products and applications in smart home appliances and smart cities. High accuracy, fast response, small volume, low power consumption, and reliable quality are the goals pursued by the next-generation electric current sensors.

There are several ways to measure an electric current in a conductor. For instance, a shunt resistor can be used to estimate the electric current by measuring the voltage difference across the shunt resistor. However, said resistor has a small resistance and therefore has a high current consumption; as such, it is not suitable for small or portable devices. Besides, the high electric current generates heat and causes other problems.

SUMMARY

The disclosure provides an electric current sensor featuring high sensitivity, high accuracy, and low power consumption.

In an embodiment of the disclosure, an electric current sensor including a substrate, a first sloped surface, a second sloped surface, at least one conductive wire, a first anisotropic magnetoresistor (AMR) unit, a second AMR unit, a first magnetization direction setting device, and a second magnetization direction setting device is provided. The first sloped surface and the second sloped surface are disposed on the substrate and arranged in a first direction. The at least one conductive wire extends along a second direction and disposed beside the substrate. The first AMR unit is disposed on the first sloped surface, and the second AMR unit is disposed on the second sloped surface. The first magnetization direction setting device is configured to set a magnetization direction of the first AMR unit, and the second magnetization direction setting device is configured to set a magnetization direction of the second AMR unit. When an electric current flows through the at least one conductive wire, a magnetic field component generated by the electric current on the first sloped surface in a third direction is opposite to a magnetic field component generated by the electric current on the second sloped surface in the third direction. The first direction, the second direction, and the third direction are different from one another, and a sensing direction of the first AMR unit and the second AMR unit is inclined relative to the first direction and the third direction and is different from the second direction. The first AMR unit and the second AMR unit are electrically connected to output a voltage signal. The voltage signal corresponds to the magnetic field components generated by the electric current on the first sloped surface and the second sloped surface in the third direction.

In the electric current sensor provided in one or more embodiments of the disclosure, the AMR units are connected to form the Wheatstone bridge for sensing the magnetic field induced by the electric current in the conductive wire, and therefore the electric current sensing operation described herein is characterized by high sensitivity and high accuracy. Besides, the electric current sensor provided in one or more embodiments of the disclosure derives the amount of the electric current from the magnetic field induced by sensing the electric current, and the AMR units are not in direct contact with the electric current and thus consume less power.

To make the above features and advantages provided in one or more of the embodiments of the disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles described herein.

FIG. 4B is coupled to an operator.

DESCRIPTION OF THE EMBODIMENTS

Figure 1:
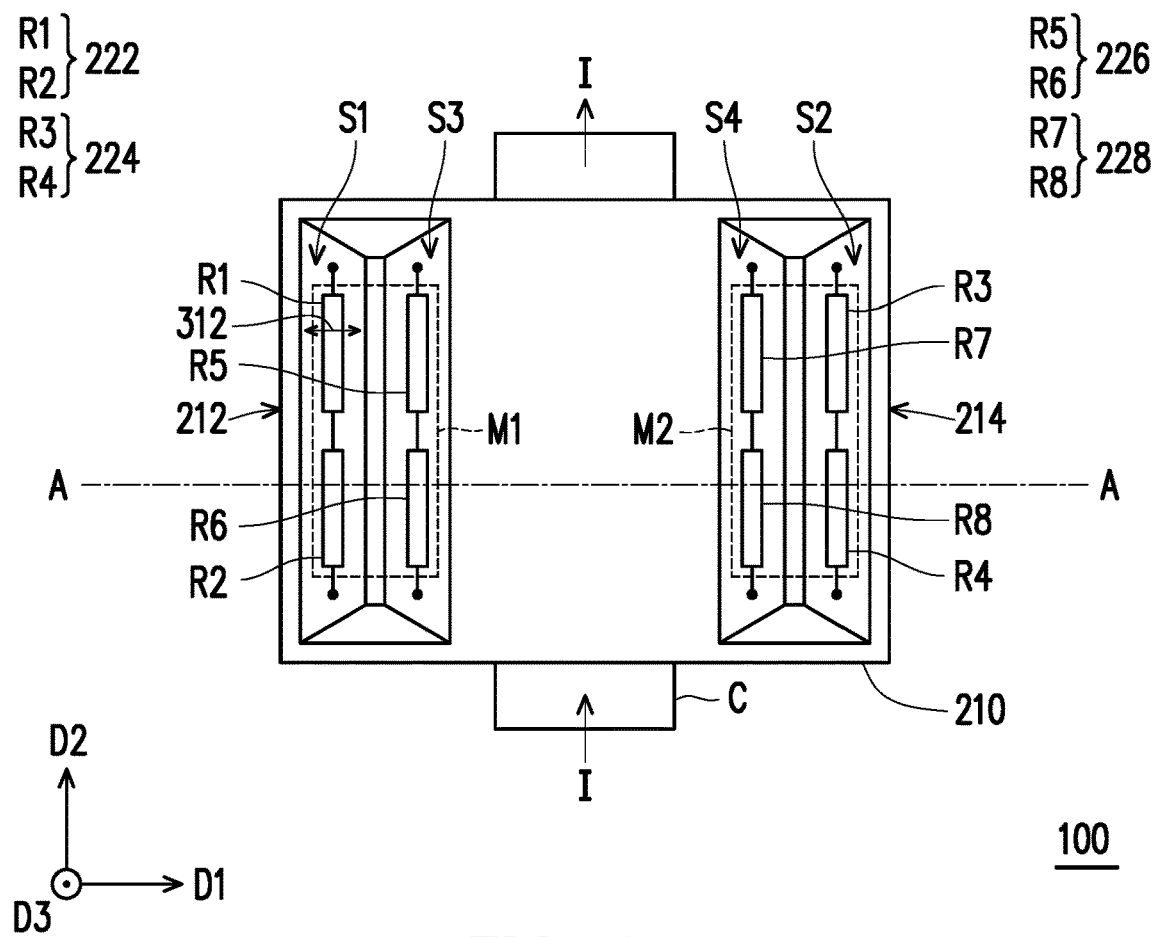
FIG. 1 is a schematic top view of an electric current sensor according to an embodiment of the disclosure.
Figure 2:
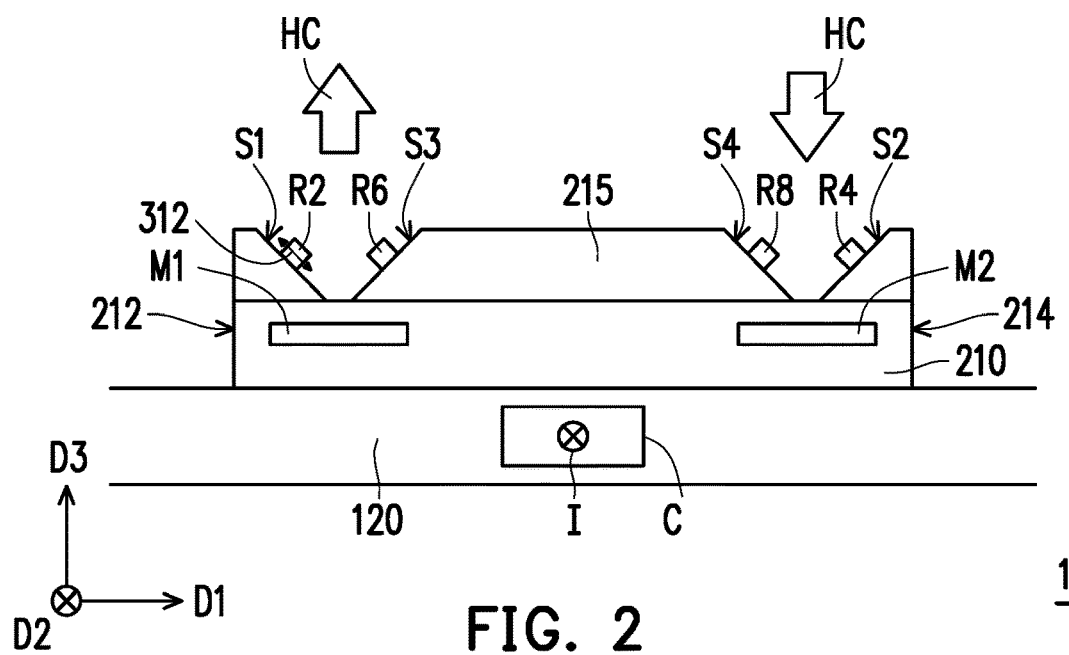
FIG. 2 is a schematic cross-sectional view illustrating the electric current sensor depicted in FIG. 1 along a line segment A-A.

FIG. 1 is a schematic top view of an electric current sensor according to an embodiment of the disclosure. FIG. 2 is a schematic cross-sectional view illustrating the electric current sensor depicted in FIG. 1 along a line segment A-A. With reference to FIG. 1 and FIG. 2, the electric current sensor 100 provided in the present embodiment includes a substrate 210, a first sloped surface S1, a second sloped surface S2, at least one conductive wire C (one conductive wire C is exemplarily shown in FIG. 1), a first anisotropic magnetoresistor (AMR) unit 222, a second AMR unit 224, a first magnetization direction setting device M1, and a second magnetization direction setting device M2. The first sloped surface S1 and the second sloped surface S2 are disposed on the substrate 210 and arranged in a first direction D1. The at least one conductive wire C extends along a second direction D2 and is disposed beside the substrate 210. In the present embodiment, an insulation layer 215 is disposed on the substrate 210, and the first sloped surface S1 and the second sloped surface S2 are surfaces of the insulation layer 215. However, in other embodiments, the first sloped surface S1 and the second sloped surface S2 may also be surfaces of the substrate 210.

The at least one conductive wire C extends along the second direction D2 and is disposed beside the substrate 210. In the present embodiment, the first sloped surface S1 and the second sloped surface S2 are located on a first side of the substrate 210 (i.e., an upper side in FIG. 2), and the at least one conductive wire C is located on a second side of the substrate 210 (i.e., a lower side in FIG. 2). Here, the first side is opposite to the second side. Besides, the insulation layer 215 is located on the first side of the substrate 210. In the present embodiment, the first sloped surface S1 and the second sloped surface S2 are respectively located beside two opposite ends (i.e., the first end 212 and the second end 214) of the substrate 210 (e.g., located at the first side), and the at least one conductive wire C is located beside a center of the substrate 210 (e.g., located at the first side). Besides, according to the present embodiment, a distance from the at least one conductive wire C to the first sloped surface S1 may be equal to a distance from the at least one conductive wire C to the second sloped surface S2.

The first AMR unit 222 is disposed on the first sloped surface S1, and the second AMR unit 224 is disposed on the second sloped surface S2. The first magnetization direction setting device M1 is configured to set a magnetization direction of the first AMR unit 222. The second magnetization direction setting device M2 is configured to set a magnetization direction of the second AMR unit 224.

When an electric current I flows through the at least one conductive wire C, a magnetic field component HC (i.e., the magnetic field component HC at the upper-left corner in FIG. 2) generated by the electric current I on the first sloped surface S1 in a third direction D3 is opposite to a magnetic field component HC (i.e., the magnetic field component HC at the upper-right corner in FIG. 2) generated by the electric current I on the second sloped surface S2 in the third direction D3 The first direction D1, the second direction D2, and the third direction D3 are different from one another, and a sensing direction 312 of the first AMR unit 222 and the second AMR unit 224 is inclined relative to the first direction D1 and the third direction D3 and is different from the second direction D2. The first AMR unit 222 and the second AMR unit 224 are electrically connected to output a voltage signal. The voltage signal corresponds to the magnetic field components HC generated by the electric current I on the first sloped surface S1 and the second sloped surface S2 in the third direction D3.

Where the electric current sensor 100 exists can be defined by the first direction D1, the second direction D2, and the third direction D3 which are different from one another; in the present embodiment, the first direction D1, the second direction D2, and the third direction D3 can be perpendicular to one another. However, in other embodiments, the first direction D1, the second direction D2, and the third direction D3 can be different from one another but are not perpendicular to one another. In the present embodiment, the third direction D3 is a direction from the second side of the substrate 210 (i.e., the lower side in FIG. 2) to the first side of the substrate 210 (i.e., the upper side in FIG. 2).

In the present embodiment, the electric current sensor further includes a third sloped surface S3, a fourth sloped surface S4, a third AMR unit 226, and a fourth AMR unit 228. The third sloped surface S3 and the fourth sloped surface S4 are disposed on the substrate 210, wherein the third sloped surface S3 and the first sloped surface S1 are opposite to each other, the fourth sloped surface S4 and the second sloped surface S2 are opposite to each other, and the first sloped surface S1, the third sloped surface S3, the fourth sloped surface S4, and the second sloped surface S2 are sequentially arranged in the first direction D1. In the present embodiment, the third sloped surface S3 and the fourth sloped surface S4 are surfaces of the insulation layer 215. That is, the insulation layer 215 has two grooves, the first sloped surface S1 and the third sloped surface S3 are two inclined sidewalls of one of the two grooves, and the second sloped surface S2 and the fourth sloped surface S4 are two inclined sidewalls of the other groove. However, in other embodiments, it is the substrate 210 that has two grooves, and the first to the fourth sloped surfaces S1, S2, S3, and S4 are the inclined sidewalls of the grooves of the substrate 210.

The third AMR unit 226 is disposed on the third sloped surface S3, and the first magnetization direction setting device M1 is also configured to set a magnetization direction of the third AMR unit 226. The fourth AMR unit 228 is disposed on the fourth sloped surface S4, and the second magnetization direction setting device M2 is also configured to set a magnetization direction of the fourth AMR unit 228. When an electric current I flows through the at least one conductive wire C, since a magnetic field HC is induced by the electric current I, resistance variations generated by the first AMR unit 222 are opposite to resistance variations generated by the third AMR unit 226, resistance variations generated by the second AMR unit 224 are opposite to resistance variations generated by the fourth AMR unit 228, and the first, the second, the third, and the fourth AMR units 222, 224, 226, and 228 are electrically connected to form a Wheatstone bridge to output voltage signals corresponding to the resistance variations generated by the first, the second, the third, and the fourth AMR units 222, 224, 226, and 228.

In the present embodiment, the first AMR unit 222 includes a first AMR R1 and a second AMR R2 sequentially arranged along a reverse direction of the second direction D2, the second AMR unit 224 includes a third AMR R3 and a fourth AMR R4 sequentially arranged along the reverse direction of the second direction D2, the third AMR unit 226 includes a fifth AMR R5 and a sixth AMR R6 sequentially arranged along the reverse direction of the second direction D2, and the fourth AMR unit 228 includes a seventh AMR R7 and an eighth AMR R8 sequentially arranged along the reverse direction of the second direction D2. The number of the first to the eighth AMRs R1-R8 is respectively one, for instance; however, in other embodiments, each of the AMRs can be replaced by a plurality of serially connected AMRs. For instance, the first AMR R1 can be replaced by a plurality of serially connected first AMRs R1.

In the present embodiment, the first magnetization direction setting device M1, the second magnetization direction setting device M2, and the first to the fourth AMR units 222, 224, 226, and 228 can be disposed on the substrate 210, and the magnetization direction setting devices and the AMR units can be separated by an insulation layer. In the present embodiment, the first magnetization direction setting device M1 is disposed below the first and the third AMR units 222 and 226, and the second magnetization direction setting device M2 is disposed below the second and the fourth AMR units 224 and 228. However, in another embodiment, the first magnetization direction setting device M1 may be disposed above the first and the third AMR units 222 and 226, and the second magnetization direction setting device M2 may be disposed above the second and the fourth AMR units 224 and 228. Alternatively, in other embodiments, the first magnetization direction setting device M1 may be located above and below the first and the third AMR units 222 and 226, and the second magnetization direction setting device M2 may also be located above and below the second and the fourth AMR units 224 and 228.

Besides, the at least one conductive wire C can be encapsulated by a package 120, while two ends of the at least one conductive wire C are exposed outside the package 120; here, the package 120 is made of an insulation material, for instance. The substrate 210 can be disposed on the package 120. In the present embodiment, the at least one conductive wire C extends along the second direction D2.

Figure 3A:
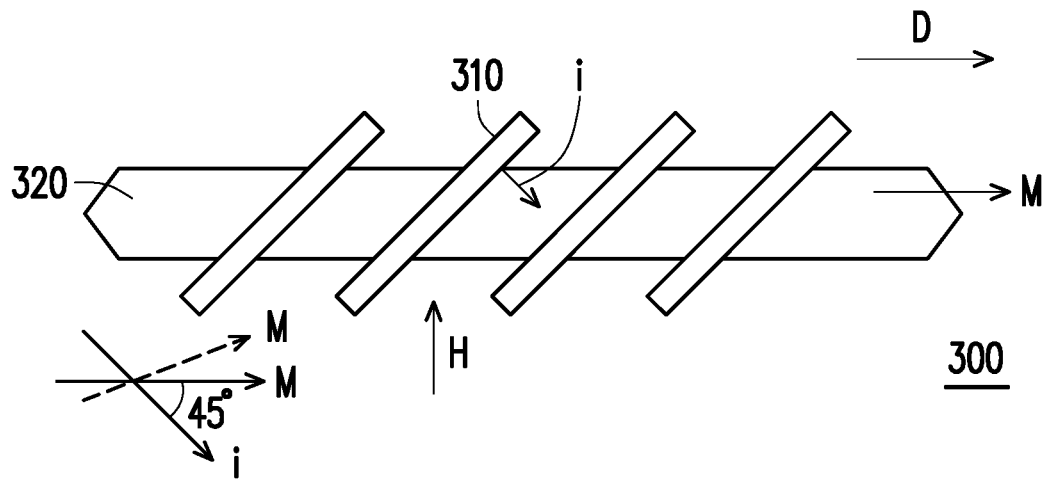
FIG. 3A and FIG. 3B are configured to explain operation principles of the anisotropic magnetoresistors (AMRs) in FIG. 1.
Figure 3B:
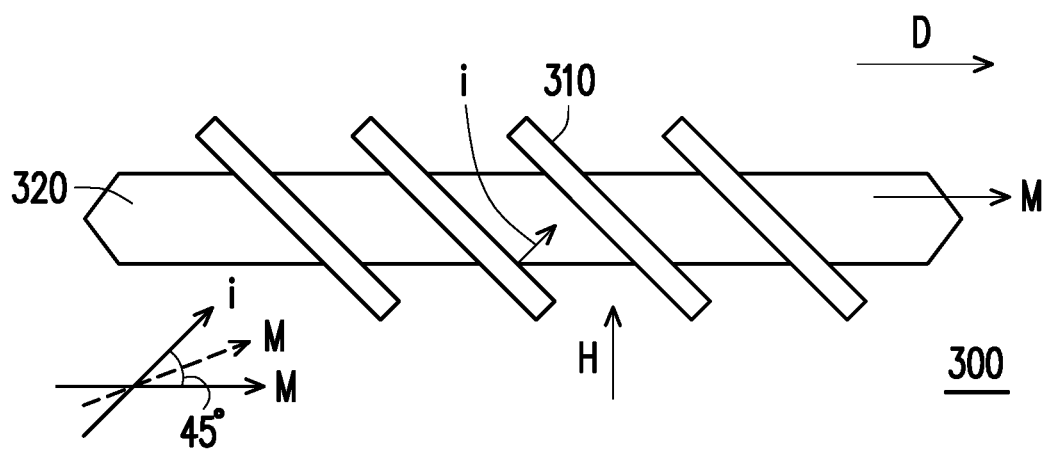

FIG. 3A and FIG. 3B are configured to explain operation principles of the AMRs in FIG. 1. With reference to FIG. 3A, the AMR 300 has a structure shaped as a barber pole; namely, a plurality of electrical shorting bars 310 extending at a 45-degree angle inclined relative to an extension direction D of the AMR 300 are disposed on a surface of the AMR 300, and the electrical shorting bars 310 are spaced apart from each other and arranged on a ferromagnetic film 320 in parallel. The ferromagnetic film 320 is the main body of the AMR 300, and an extension direction of the ferromagnetic film 320 is the extension direction D of the AMR 300. Additionally, two opposite ends of the ferromagnetic film 320 can be shaped as tips.

Before the AMR 300 starts to measure an external magnetic field H, the magnetization direction setting device (e.g., the first magnetization direction setting device M1 or the second magnetization direction setting device M2 depicted in FIG. 1) can be applied to set a magnetization direction of the AMR 300, wherein the magnetization direction setting devices are, for instance, conductive wires, metal sheets, conductors, or coils that can induce the magnetic field by electricity. In FIG. 3A, the magnetization direction setting devices can induce the magnetic field along the extension direction by electricity, so that the AMR 300 can have the magnetization direction M.

No electric current then flows through the magnetization direction setting devices, so as to allow the AMR 300 to start measuring the external magnetic field H. When there is no external magnetic field H, the magnetization direction M of the AMR 300 stays in the extension direction D; at this time, an electric current i is applied to flow from the left end to the right end of the AMR 300, and the flow direction of the electric current i around the electrical shorting bars 310 is perpendicular to the extension direction of the electrical shorting bars 310, whereby the included angle between the flow direction of the electric current i around the electrical shorting bars 310 and the magnetization direction M is 45 degrees, and the resistance of the AMR 300 at this time is R.

When there is an external magnetic field H toward a direction perpendicular to the extension direction D, the magnetization direction M of the AMR 300 deflects toward the direction of the external magnetic field H, so that the included angle between the flow direction of the electric current i around the electrical shorting bars 310 and the magnetization direction M is greater than 45 degrees; at this time, the resistance variation of the AMR 300 is $-\Delta R$, i.e., $R-\Delta R$. That is, the resistance decreases, wherein $\Delta R$ is greater than zero.

However, as shown in FIG. 3B, when the included angle between the extension direction of the electrical shorting bars 310 as shown in FIG. 3B and the extension direction of the electrical shorting bars 310 as shown in FIG. 3A is 90 degrees (here, the included angle between the extension direction of the electrical shorting bars 310 as shown in FIG. 3B and the extension direction D of the AMR 300 is still 45 degrees), and when the external magnetic field H exists, the external magnetic field H has the magnetization direction M deflect toward the direction of the external magnetic field H. At this time, the included angle between the magnetization direction M and the flow direction of the electric current i around the electrical shorting bars 310 is less than 45 degrees. As such, the resistance of the AMR 300 becomes $R+\Delta R$, i.e., the resistance of the AMR 300 increases.

Additionally, when the magnetization direction setting devices are applied to set the magnetization direction M of the AMR 300 as the reverse direction shown in FIG. 3A, the resistance of the AMR 300 in FIG. 3A becomes $R+\Delta R$ while the external magnetic field H exists. Moreover, when the magnetization direction setting devices are applied to set the magnetization direction M of the AMR 300 as the reverse direction shown in FIG. 3B, the resistance of the AMR 300 in FIG. 3B becomes $R-\Delta R$ while the external magnetic field H exists.

From the above, it can be learned that the resistance R of the AMR 300 corresponding to the external magnetic field H is varied from $+\Delta R$ to $-\Delta R$ or vice versa when the direction in which the electrical shorting bars 310 are arranged is changed, and when the magnetization direction M set by the magnetization direction setting devices is changed to the reverse direction, the resistance R of the AMR 300 corresponding to the external magnetic field H is varied from $+\Delta R$ to $-\Delta R$ or vice versa. When the external magnetic field H is changed to the reverse direction, the resistance R of the AMR 300 corresponding to the external magnetic field H is varied from $+\Delta R$ to $-\Delta R$ or vice versa. However, when the direction of the electric current i flowing through the AMR 300 is reversed, the variation of the resistance R of the AMR 300 corresponding to the external magnetic field H remains without changing the positive/negative sign, i.e., if the variation is $+\Delta R$, the variation remains at $+\Delta R$ while the direction of the electric current i is reversed; if the variation is $-\Delta R$, the variation remains at $-\Delta R$ while the direction of the electric current i is reversed.

According to said principles, when the AMR 300 is subject to a certain component of the external magnetic field H, the variation direction of the resistance R of the AMR 300 can be determined through designing the extension direction of the electrical shorting bars 310 or the magnetization direction M set by the magnetization direction setting devices, i.e., the increase or decrease of the resistance R (e.g., the variation +ΔR or −ΔR). Besides, a direction perpendicular to the extension direction D of the AMR 300 is a sensing direction of the AMR 300 (as the sensing direction 312 shown in FIG. 1 and FIG. 2) and is the direction parallel to the external magnetic field H as shown in FIG. 3A and FIG. 3B.

Figure 4A:
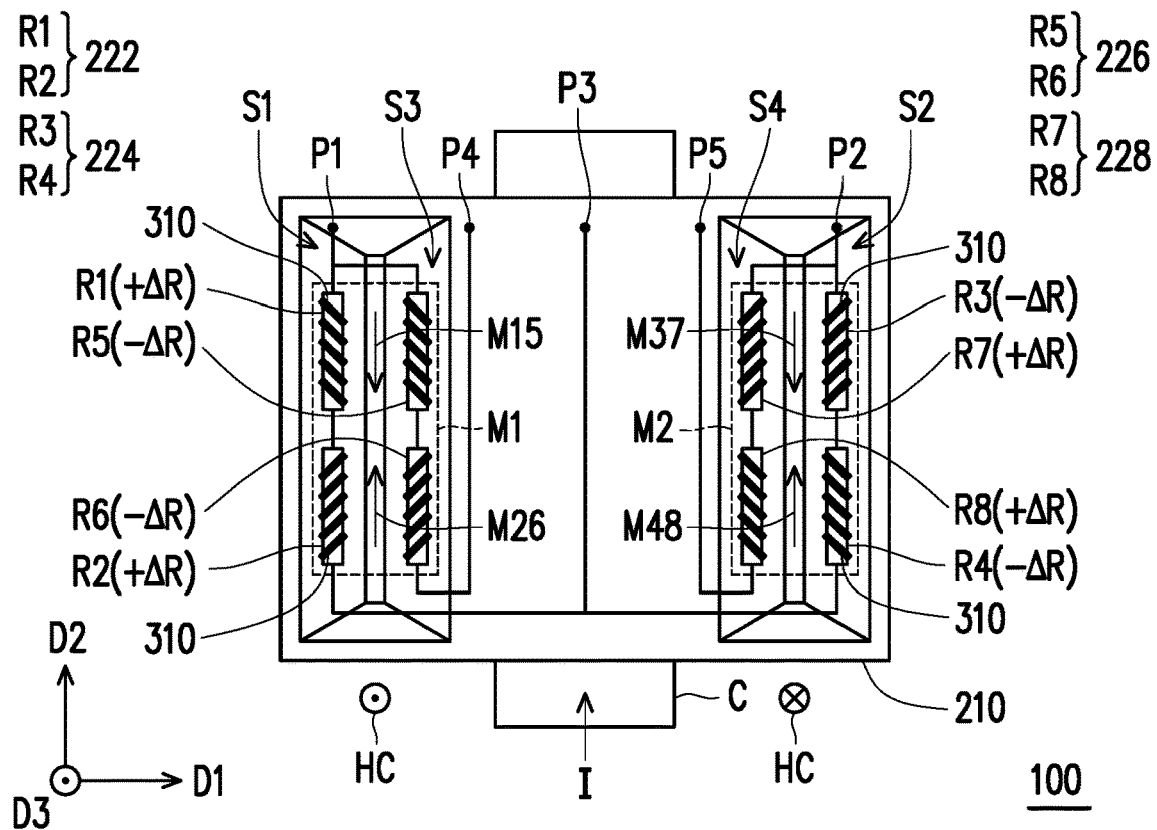
FIG. 4A and FIG. 4B respectively illustrate magnetization directions of the AMRs of the electric current sensor depicted in FIG. 1 at a first timing and a second timing and following resistance variations.
Figure 4B:
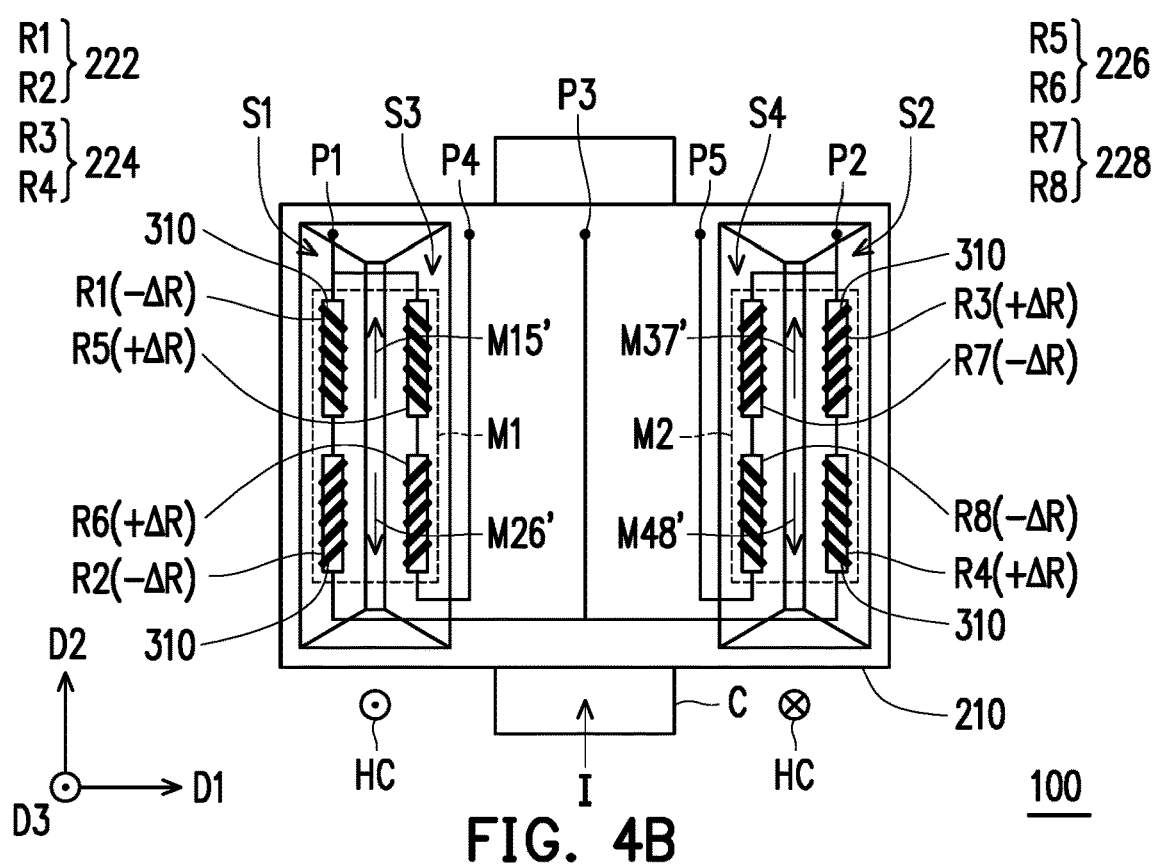

FIG. 4A and FIG. 4B respectively illustrate magnetization directions of the AMRs of the electric current sensor depicted in FIG. 1 at a first timing and a second timing and following resistance variations. Note that the extension directions of the electrical shorting bars in the first to the eighth AMRs R1-R8 are also depicted. With reference to FIG. 4A and FIG. 4B, in the present embodiment, the extension directions of the first to the eighth AMRs R1-R8 are the second direction D2, and the extension directions of the electrical shorting bars 310 therein are shown in FIG. 4A. Specifically, in the first and the fourth AMR units 222 and 228, the included angle between the electrical shorting bars 310 of the first, the second, the seventh, and the eighth AMRs R1, R2, R7, and R8 and the second direction D2 is 45 degrees in two different directions, and the two different directions are parallel to the first sloped surface S1 and the fourth sloped surface S4. Besides, in the second and the third AMR units 224 and 226, the included angle between the electrical shorting bars 310 of the third, the fourth, the fifth, and the sixth AMRs R3, R4, R5, and R6 and the second direction D2 is 45 degrees in another two different directions, and the another two different directions are parallel to the second sloped surface S2 and the third sloped surface S3. In the present embodiment, the first sloped surface S1 and the fourth sloped surface S4 are parallel to each other, the second sloped surface S2 and the third sloped surface S3 are parallel to each other, and the first sloped surface S1 and the second sloped surface S2 are inclined toward different directions, respectively.

When the electric current I flows through the at least one conductive wire C (as shown in FIG. 1, FIG. 2, FIG. 4A, and FIG. 4B), the direction of the electric current I in the at least one conductive wire C is the second direction D2, for instance. At this time, the electric current I generates the magnetic field component HC along the third direction D3 on the first, the second, the fifth, and the sixth AMRs R1, R2, R5, and R6, and the electric current I generates the magnetic field component HC along a reverse direction of the third direction D3 on the third, the fourth, the seventh, and the eighth AMRs R3, R4, R7, and R8. In addition, according to the present embodiment, when the electric current I flows through the at least one conductive wire C, a component direction (i.e., the magnetic field component HC shown on the left-hand side in FIG. 2, FIG. 4A, and FIG. 4B and facing the third direction D3) of the magnetic field induced at the first sloped surface S1 and the third sloped surface S3 (i.e., at the first AMR unit 222 and the third AMR unit 226) in the third direction D3 is opposite to a component direction (i.e., the magnetic field component HC shown on the right-hand side in FIG. 2, FIG. 4A, and FIG. 4B and facing the reverse direction of the third direction D3) of the magnetic field induced at the second sloped surface S2 and the fourth sloped surface S4 (i.e., at the second AMR unit 224 and the fourth AMR unit 228) in the third direction D3.

At a first timing, the first magnetization direction setting device M1 sets the magnetization direction M15 of the first AMR R1 and the fifth AMR R5 as the reverse direction of the second direction D2 and sets the magnetization direction M26 of the second AMR R2 and the sixth AMR R6 as the second direction D2. Besides, at the first timing, the second magnetization direction setting device M2 sets the magnetization direction M37 of the third AMR R3 and the seventh AMR R7 as the reverse direction of the second direction D2 and sets the magnetization direction M48 of the fourth AMR R4 and the eighth AMR R8 as the second direction D2. In the present embodiment, the first magnetization direction setting device M1 and the second magnetization direction setting device M2 are, for instance, conductive coils, conductive wires, conductive sheets (e.g., metal sheets), or conductors; any conductive structure that can induce the magnetic field by electricity; any conductive structure that is able to induce the magnetic field along the magnetization directions M15, M26, M37, and M48 can serve as the first magnetization direction setting device M1 and the second magnetization direction setting device M2.

After the first timing, the first magnetization direction setting device M1 and the second magnetization direction setting device M2 stop inducing the magnetic field; for instance, no electric current flows through the first magnetization direction setting device M1 and the second magnetization direction setting device M2, and thus no magnetic field is induced. At this time, the first, the second, the fifth, and the sixth AMRs R1, R2, R5, and R6 can respectively have the resistance variations +ΔR, +ΔR, −ΔR, and −ΔR due to the magnetic field component HC induced by the electric current I (i.e., the magnetic field component HC shown on the left-hand side in FIG. 2, FIG. 4A, and FIG. 4B), and the third, the fourth, the seventh, and the eighth AMRs R3, R4, R7, and R8 can respectively have the resistance variations −ΔR, −ΔR, +ΔR, and +ΔR due to the magnetic field component HC induced by the electric current I (i.e., the magnetic field component HC shown on the right-hand side in FIG. 2, FIG. 4A, and FIG. 4B).

According to the present embodiment, the first AMR R1, the second AMR R2, the third AMR R3, and the fourth AMR R4 can be sequentially connected in series from the contact P1 to the contact P2, and the contact P3 can be electrically connected to a conductive path between the second AMR R2 and the fourth AMR R4; the fifth AMR R5 and the sixth AMR R6 can be sequentially connected in series from the contact P1 to the contact P4, and the seventh AMR R7 and the eighth AMR R8 can be sequentially connected in series from the contact P2 to the contact P5. The contact P3 can receive a reference voltage VDD, and the contact P4 and the contact P5 can be grounded; at this time, the voltage difference between the contact P1 and the contact P2 in the Wheatstone bridge is (VDD)×(−ΔR/R) and can be an output signal, and the output signal is a differential signal whose value corresponds to the value of the magnetic field component HC and further corresponds to the amount of the electric current I flowing through the at least one conductive wire C. The output signal is referred to as a first voltage signal $V_1$ hereinafter. In another embodiment, the contact P3 can be grounded, while the contact P4 and the contact P5 receive the reference voltage VDD.

At a second timing following the first timing, the first magnetization direction setting device M1 sets the magnetization direction M13' of the first AMR R1 and the third AMR R3 as the second direction D2 and sets the magnetization direction M24' of the second AMR R2 and the fourth AMR R4 as the reverse direction of the second direction D2.

Besides, at the second timing, the second magnetization direction setting device M2 sets the magnetization direction M57' of the fifth AMR R5 and the seventh AMR R7 as the second direction D2 and sets the magnetization direction M68' of the sixth AMR R6 and the eighth AMR R8 as the reverse direction of the second direction D2.

After the second timing, the first magnetization direction setting device M1 and the second magnetization direction setting device M2 stop inducing the magnetic field; at this time, the first to the fourth AMRs R1-R4 can respectively have the resistance variations $-\Delta R$, $-\Delta R$, $+\Delta R$, and $+\Delta R$ due to the magnetic field component HC induced by the electric current I1, and the fifth to the eighth AMRs R5-R8 can respectively have the resistance variations $+\Delta R$, $+\Delta R$, $-\Delta R$, and $-\Delta R$ due to the magnetic field component HC induced by the electric current I. The voltage difference between the contact P1 and the contact P2 in the Wheatstone bridge is $(VDD) \times (-\Delta R/R)$ and can be an output signal, and the output signal is a differential signal whose values corresponds to the value of the magnetic field component HC and further corresponds to the amount of the electric current I flowing through the at least one conductive wire C. The output signal is referred to as a second voltage signal $V_2$ hereinafter.

Figure 5:
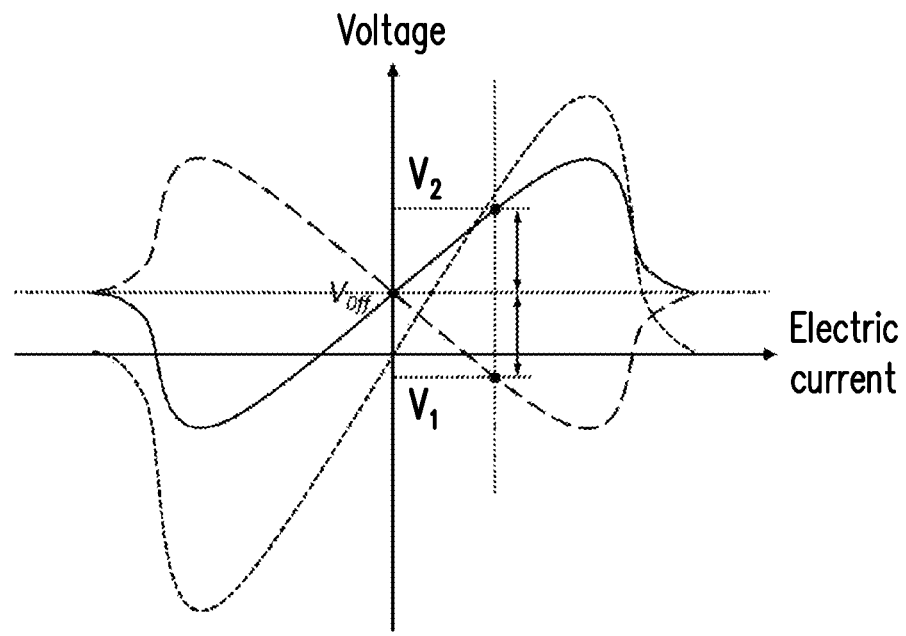
FIG. 5 is an output voltage-current curve of the Wheatstone bridge depicted in FIG. 4A and FIG. 4B.
Figure 6:
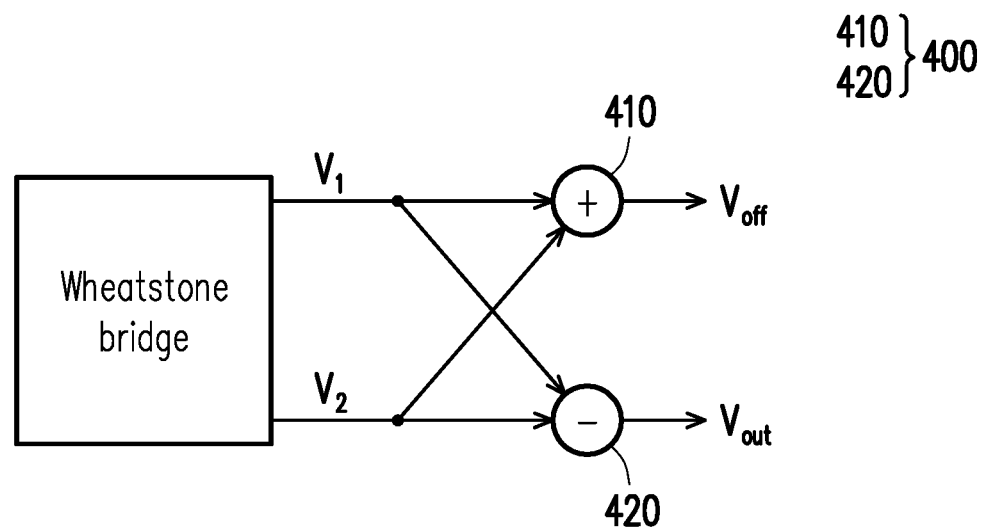
FIG. 6 illustrates that the Wheatstone bridge depicted in FIG. 4A

FIG. 5 is an output voltage-current curve of the Wheatstone bridge depicted in FIG. 4A and FIG. 4B. FIG. 6 illustrates that the Wheatstone bridge depicted in FIG. 4A and FIG. 4B is coupled to an operator. With reference to FIG. 4A, FIG. 4B, FIG. 5, and FIG. 6, in the present embodiment, the electric current sensor 100 further includes an operator 400 electrically connected to an output terminal of the Wheatstone bridge (i.e., receives the first voltage signal $V_1$ and the second voltage signal $V_2$), wherein the first magnetization direction setting device M1 and the second magnetization direction setting device M2 set a combination of magnetization directions of the first, the second, the third, and the fourth AMR units 222, 224, 226, and 228 as a first combination (i.e., the combination of the magnetization direction M15, the magnetization direction M26, the magnetization direction M37, and the magnetization direction M48 shown in FIG. 4A), so as to allow the Wheatstone bridge to subsequently output the first voltage signal $V_1$. The first magnetization direction setting device M1 and the second magnetization direction setting device M2 then set another combination of the magnetization directions of the first, the second, the third, and the fourth AMR units 222, 224, 226, and 228 as a second combination (i.e., the combination of the magnetization direction M15', the magnetization direction M26', the magnetization direction M37', and the magnetization direction M48' shown in FIG. 4B) opposite to the first combination, so as to allow the Wheatstone bridge to subsequently output the second voltage signal $V_2$. The operator 400 is configured to subtract the first voltage signal $V_2$ from the second voltage signal $V_1$ or subtract the second voltage signal $V_2$ from the first voltage signal $V_1$, so as to output an output voltage signal $V_{out}$ corresponding to a magnitude of the magnetic field induced by the electric current I. Besides, in the present embodiment, the operator 400 can be configured to add the first voltage signal $V_1$ and the second voltage signal $V_2$ to output an offset voltage signal $V_{off}$.

Specifically, the operator 400 can include an arithmetic operator 410 and an arithmetic operator 420, wherein the arithmetic operator 410 is, for instance, an adder configured to add the first voltage signal $V_1$ and the second voltage signal $V_2$, so as to output the offset voltage signal $V_{off}$. In addition, the arithmetic operator 420 is, for instance, a subtracter configured to subtract the first voltage signal $V_2$ from the second voltage signal $V_1$ or subtract the second voltage signal $V_2$ from the first voltage signal $V_1$, so as to output the output voltage signal $V_{out}$ corresponding to the magnitude of the magnetic field induced by the electric current I.

It can be learned from FIG. 5 that there may be an offset voltage signal $V_{off}$ in the output voltage-current curve of the Wheatstone bridge, and after the first voltage signal $V_1$ and the second voltage signal $V_2$ are added, what remains is the offset voltage signal $V_{off}$; besides, after the first voltage signal $V_1$ is subtracted from the second voltage signal $V_2$ or vice versa, the output voltage-current curve passes through a point where the values of the voltage and the electric current are both zero. Thereby, the voltage and the electric current are almost proportional within a certain range, so that the resistance variation $\Delta R$ can be precisely estimated based on the output voltage signal $V_{out}$.

In the present embodiment, the contacts P1-P5 and the operator 400 exist in the substrate 210, for instance, and the substrate 210 is a circuit substrate, e.g., a semiconductor substrate.

Figure 7:
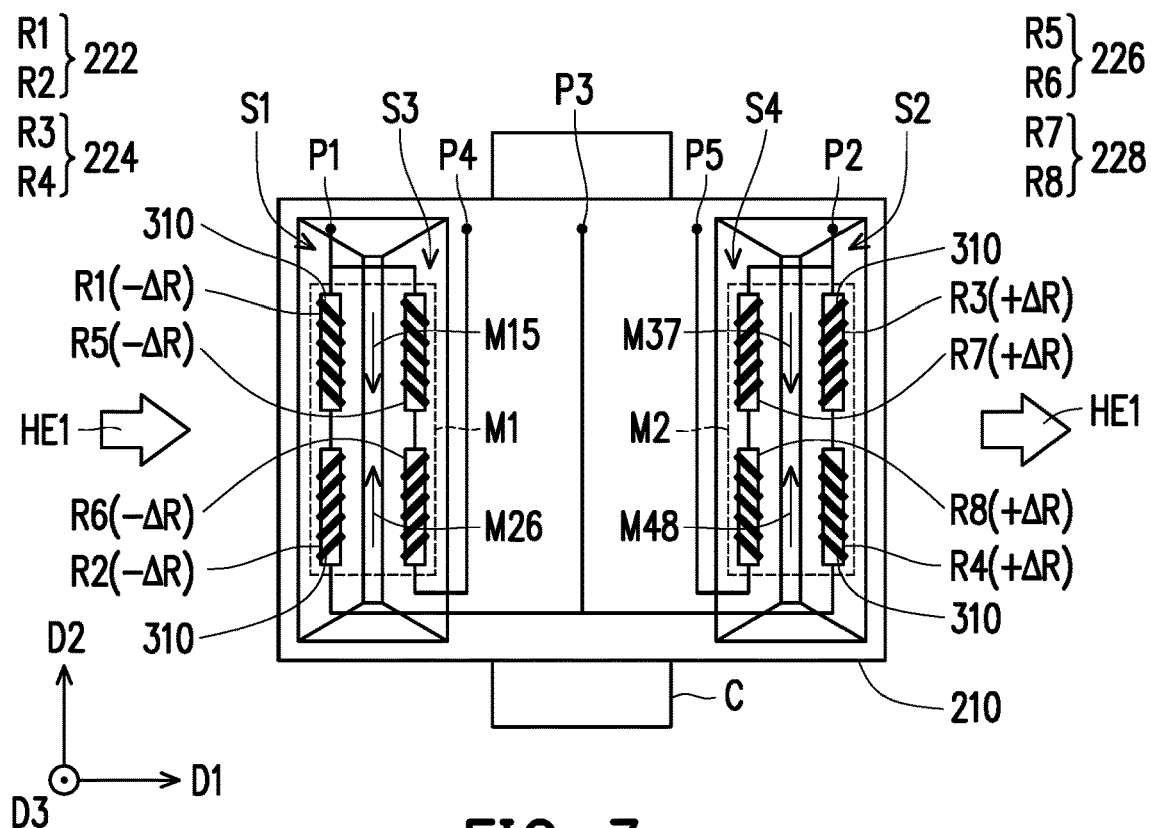
FIG. 7 illustrates magnetization directions of the AMRs of the electric current sensor depicted in FIG. 1 at the first timing and following resistance variations while external magnetic field components in three different directions are given.
Figure 8:
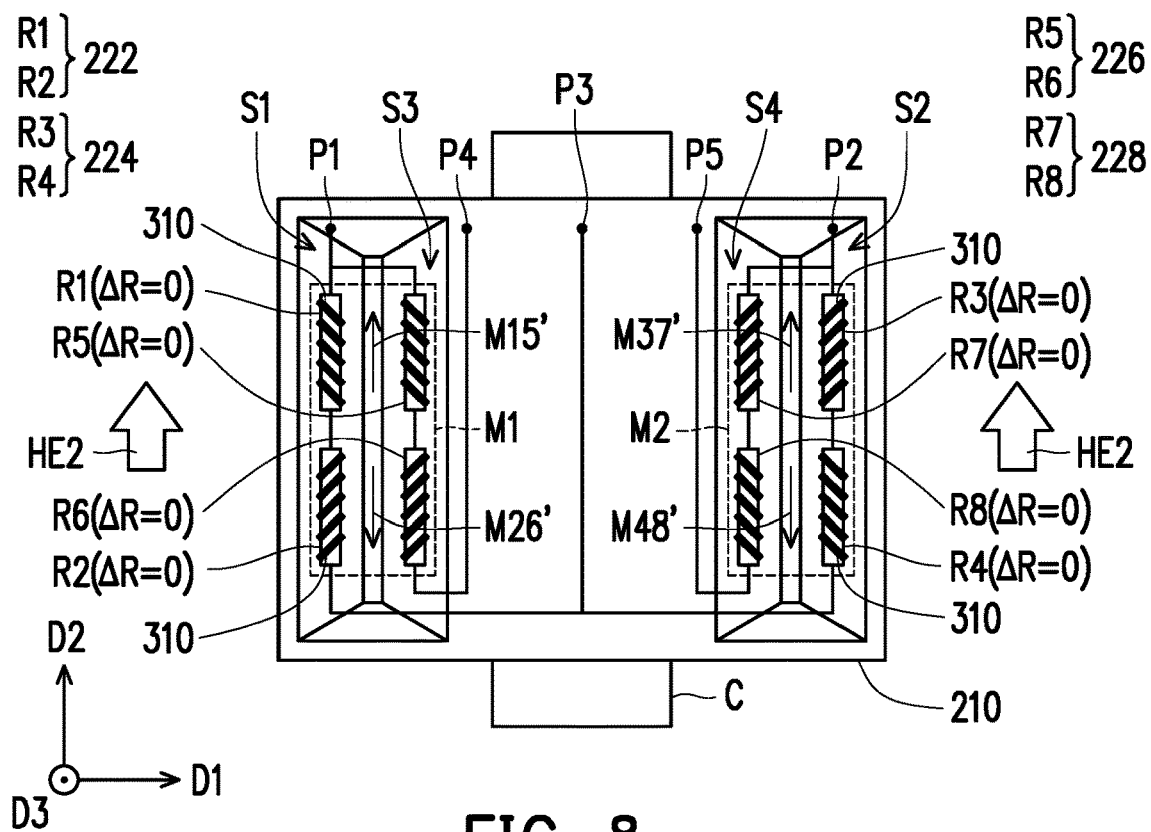
FIG. 8 and FIG. 9 respectively illustrate magnetization directions of the AMRs of the electric current sensor depicted in FIG. 1 at the second timing and following resistance variations while external magnetic field components in three different directions are given.
Figure 9:
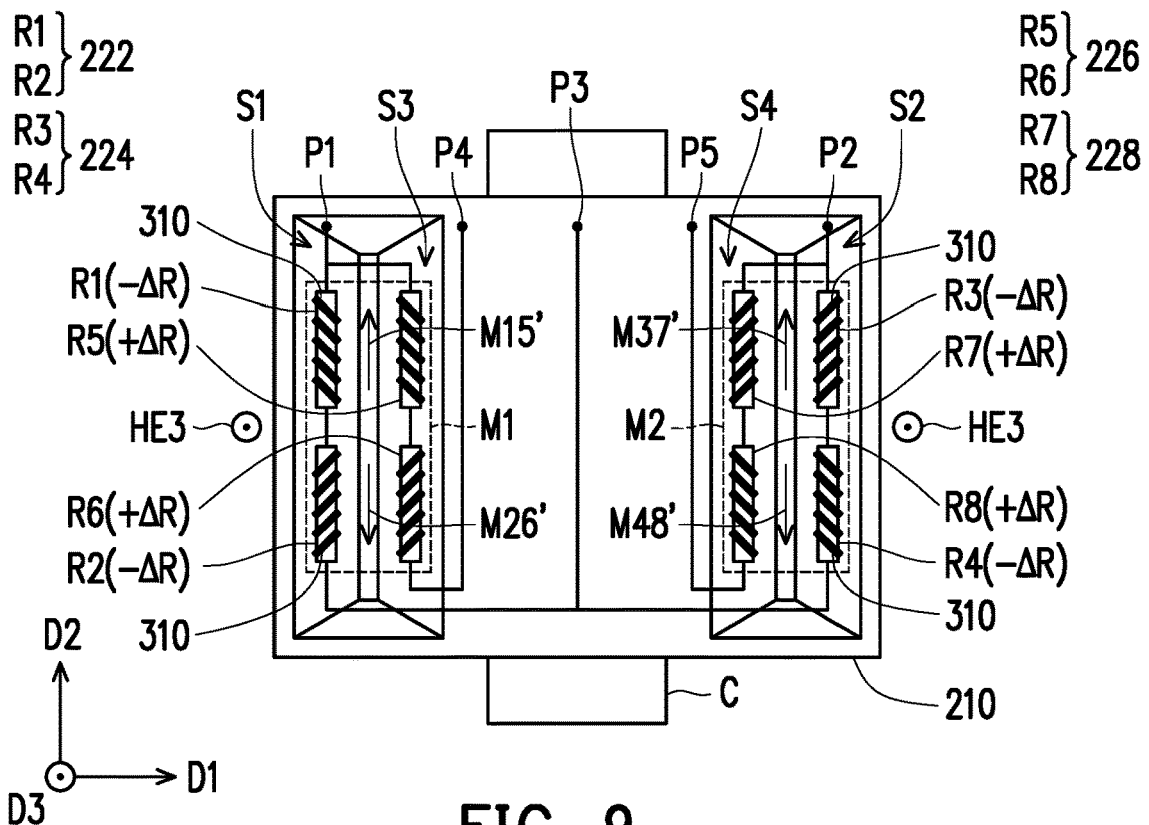

FIG. 7 illustrates magnetization directions of the AMRs of the electric current sensor depicted in FIG. 1 at the first timing and following resistance variations while external magnetic field components in three different directions are given, and FIG. 8, and FIG. 9 respectively illustrate magnetization directions of the AMRs of the electric current sensor depicted in FIG. 1 at the second timing and following resistance variations while external magnetic field components in three different directions are given. With reference to FIG. 7, after the first magnetization direction setting device M1 and the second magnetization direction setting device M2 completely set the magnetization directions M15, M26, M37, and M48 at the first timing, and when there is an external magnetic field component HE1 along the first direction D1, the resistance variations of the first to the eighths AMRs R1-R8 are $-\Delta R$, $-\Delta R$, $+\Delta R$, $+\Delta R$, $-\Delta R$, $-\Delta R$, $+\Delta R$, and $+\Delta R$, respectively; thereby, when the contact P3 receives the reference voltage VDD, and the contact P4 and the contact P5 are grounded, the voltage difference between the contact P1 and the contact P2 in the Wheatstone bridge is zero.

With reference to FIG. 8, after the first magnetization direction setting device M1 and the second magnetization direction setting device M2 at the second timing completely set the magnetization directions M15', M26', M37', and M48', and when there is an external magnetic field component HE2 along the second direction D2, the resistance variations of the first to the eighth AMRs R1-R8 are zero. This is because the second direction D2 cannot be sensed by the first to the eighth AMRs R1-R8. As such, when the contact P3 receives the reference voltage VDD, and the contact P4 and the contact P5 are grounded, the voltage difference between the contact P1 and the contact P2 in the Wheatstone bridge is zero.

With reference to FIG. 9, after the first magnetization direction setting device M1 and the second magnetization direction setting device M2 completely set the magnetization directions M15', M26', M37', and M48' at the second timing, and when there is an external magnetic field component HE3 along the third direction D3, the resistance variations of the first to the eighth AMRs R1-R8 are $-\Delta R$, $-\Delta R$, $-\Delta R$, $-\Delta R$, $+\Delta R$, $+\Delta R$, $+\Delta R$, and $+\Delta R$, respectively. As such, when the contact P3 receives the reference voltage VDD, and the contact P4 and the contact P5 are grounded, the voltage difference between the contact P1 and the contact P2 in the Wheatstone bridge is zero.

That is, in the present embodiment, an output voltage signal of the Wheatstone bridge corresponding to the external magnetic field component HE1 in the first direction D1 is zero, an output voltage signal of the Wheatstone bridge corresponding to the external magnetic field component HE2 in the second direction D2 is zero, and an output voltage signal of the Wheatstone bridge corresponding to the external magnetic field component HE3 in the third direction D3 is zero. Therefore, no matter which direction the external magnetic field is in, the sensing result of the electric current sensor 100 provided in the present embodiment is not affected, i.e., there is no interference in the output voltage of the electric current sensor 100.

The reaction of the Wheatstone bridge after the first timing is exemplified to explain how the Wheatstone bridge reacts with the external magnetic field component HE1, and the reaction of the Wheatstone bridge after the second timing is exemplified to explain how the Wheatstone bridge reacts with the external magnetic field components HE2 and HE3. After the second timing, i.e., after the first magnetization direction setting device M1 and the second magnetization direction setting device M2 completely set the magnetization directions M15', M26', M37', and M48' at the second timing, as shown in FIG. 4B, the resistance variations of the first to the eighth AMRs R1-R8 in response to the external magnetic field component HE1 are $+\Delta R$, $+\Delta R$, $-\Delta R$, $-\Delta R$, $+\Delta R$, $+\Delta R$, $-\Delta R$, and $-\Delta R$, respectively. As such, when the contact P3 receives the reference voltage VDD, and the contact P4 and the contact P5 are grounded, the voltage difference between the contact P1 and the contact P2 in the Wheatstone bridge is zero. After the first magnetization direction setting device M1 and the second magnetization direction setting device M2 completely set the magnetization directions M15, M26, M37, and M48 as shown in FIG. 4A at the first timing, the first to the eighth AMRs R1-R8 are not subject to the impact of the external magnetic field component HE2; hence, no resistance variation is generated, and the voltage difference between the contact P1 and the contact P2 in the Wheatstone bridge is still zero; and when there is an external magnetic field component HE3, the resistance variations of the first to the eighth AMRs R1-R8 in response to the external magnetic field component HE3 are $+\Delta R$, $+\Delta R$, $+\Delta R$, $+\Delta R$, $-\Delta R$, $-\Delta R$, $-\Delta R$, and $-\Delta R$, respectively. Thereby, when the contact P3 receives the reference voltage VDD, and the contact P4 and the contact P5 are grounded, the voltage difference between the contact P1 and the contact P2 in the Wheatstone bridge is zero. As a result, the external magnetic field in any direction does not interfere with the electric current sensor 100 provided in one or more embodiments of the disclosure after the first timing or after the second timing.

A feedback coil may also be disposed in or on the substrate 210 and is at least partially overlapped with the first to the eighth AMRs R1-R8 for close-loop control.

Figure 10:
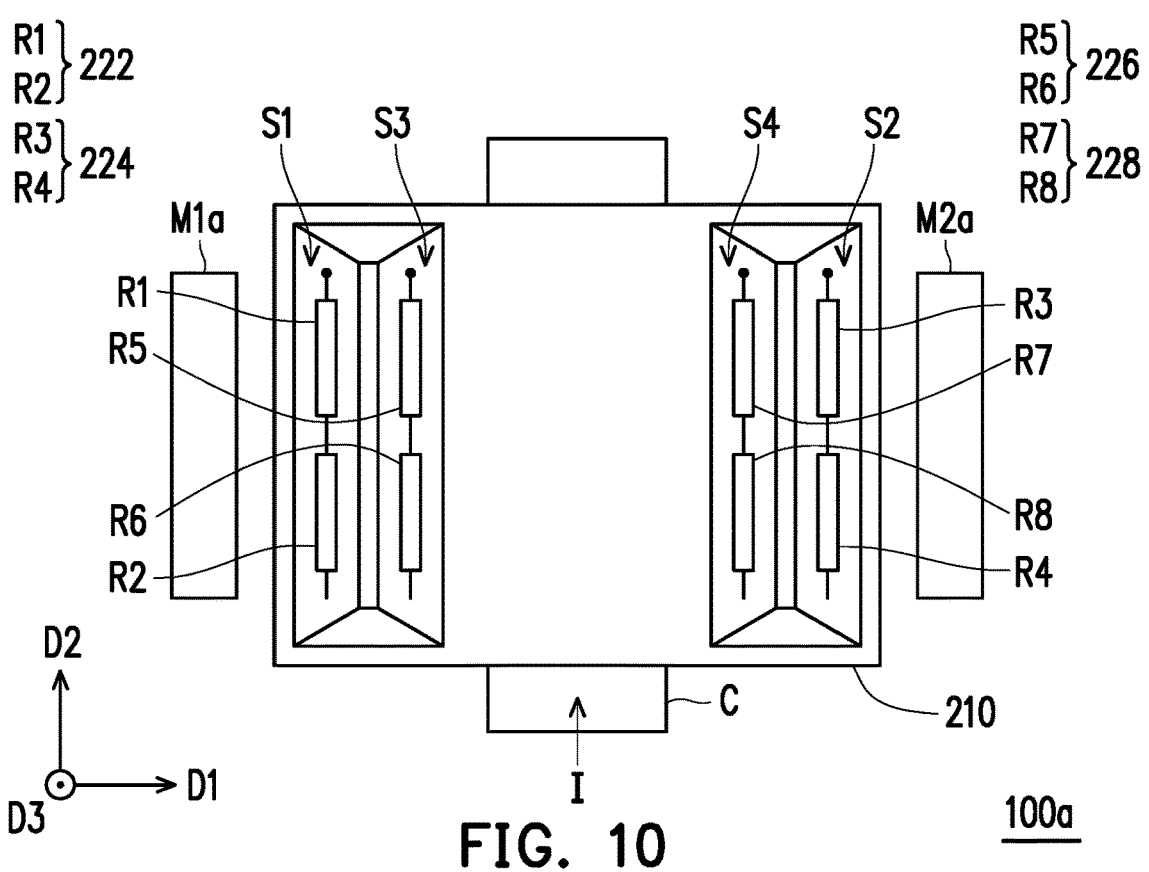
FIG. 10 is a schematic top view of an electric current sensor according to another embodiment of the disclosure.

FIG. 10 is a schematic top view of an electric current sensor according to another embodiment of the disclosure. With reference to FIG. 10, the electric current sensor 100a provided in the embodiment is similar to the electric current sensor 100 depicted in FIG. 1, FIG. 2, FIG. 4A, and FIG. 4B, and the difference therebetween is described below. In the present embodiment, a first magnetization direction setting device M1a and a second magnetization direction setting device M2a of the electric current sensor 100a are permanent magnets, wherein the first magnetization direction setting device M1a is configured to set the magnetization directions of the first, the second, the fifth, and the sixth AMRs R1, R2, R5, and R6 as a magnetization direction M1256 pointing at the reverse direction of the second direction D2, and the second magnetization direction setting device M2a is configured to set the magnetization directions of the third, the fourth, the seventh, and the eighth AMRs R3, R4, R7, and R8 as a magnetization direction M3478 pointing at the reverse direction of the second direction D2.

Besides, the extension directions of the shorting bars of the first, the third, the fifth, and the seventh AMRs R1, R3, R5, and R7 can be the same as the extension directions of the shorting bars of the first, the third, the fifth, and the seventh AMRs R1, R3, R5, and R7 depicted in FIG. 4A. The difference between FIG. 4A and FIG. 10 lies in that the extension direction of the shorting bar of the second AMR R2 is the same as the extension direction of the shorting bar of the first AMR R1, the extension direction of the shorting bar of the fourth AMR R4 is the same as the extension direction of the shorting bar of the third AMR R3, the extension direction of the shorting bar of the sixth AMR R6 is the same as the extension direction of the shorting bar of the fifth AMR R5, and the extension direction of the shorting bar of the eighth AMR R8 is the same as the extension direction of the shorting bar of the seventh AMR R7.

As such, when the electric current I flows through the at least one conductive wire C, the Wheatstone bridge constituted by connecting the first to the eighth AMRs R1-R8 can also output the corresponding voltage signal.

Figure 11:
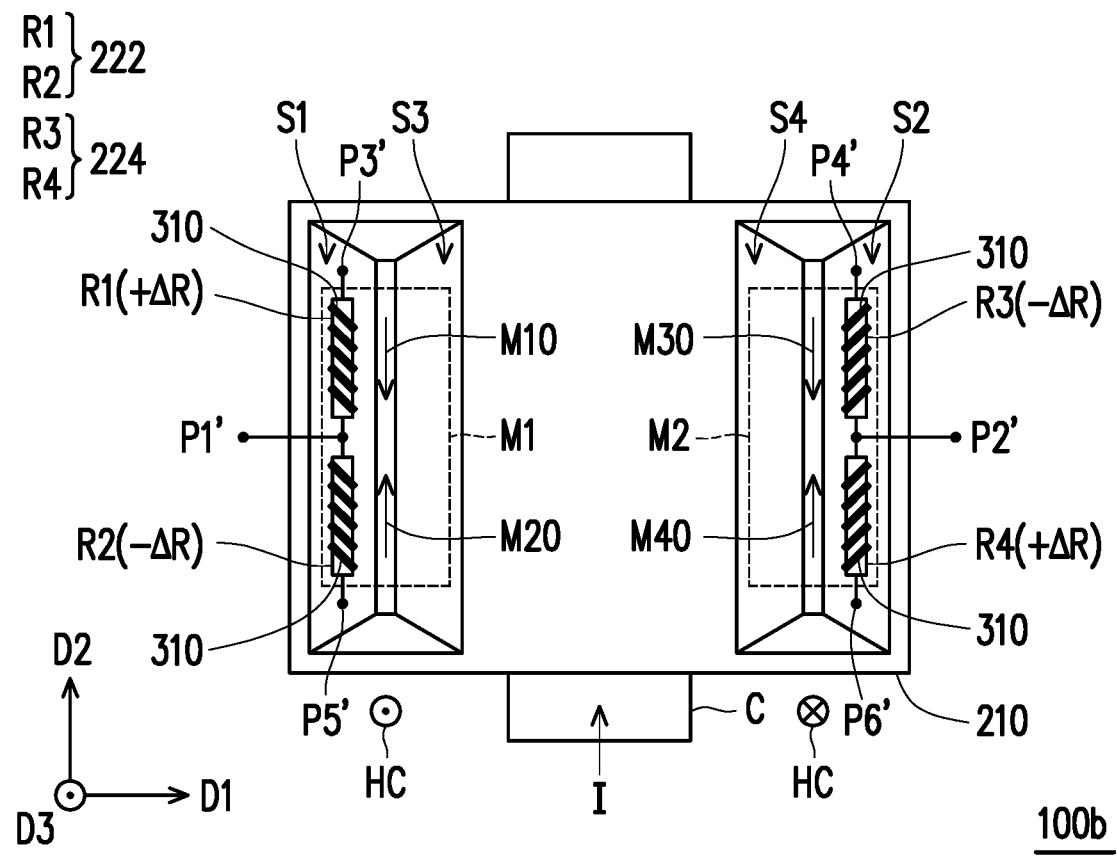
FIG. 11 is a schematic top view of an electric current sensor according to still another embodiment of the disclosure.

FIG. 11 is a schematic top view of an electric current sensor according to still another embodiment of the disclosure. With reference to FIG. 11, the electric current sensor 100b provided in the embodiment is similar to the electric current sensor 100 depicted in FIG. 4A, and the difference therebetween is described below. The electric current sensor 100b provided in the embodiment includes the first AMR unit 222 and the second AMR unit 224 but does not include the third AMR unit 226 and the fourth AMR unit 228 depicted in FIG. 4A.

In the present embodiment, the extension directions of the shorting bars 310 of the first AMR R1 here and the first AMR R1 in FIG. 4A are the same, and the extension directions of the shorting bars 310 of the third AMR R3 here and the third AMR R3 in FIG. 4A are the same. However, the difference between the present embodiment and the embodiment depicted in FIG. 4A lies in that the extension directions of the shorting bars 310 of the second AMR R2 and the first AMR R1 are the same in the present embodiment, and the extension directions of the shorting bars 310 of the fourth AMR R4 and the third AMR R3 are the same in the present embodiment.

Additionally, at the first timing, the first magnetization direction setting device M1 sets the magnetization direction of the first AMR R1 as a magnetization direction M10 pointing at the reverse direction of the second direction D2; the first magnetization direction setting device M1 sets the magnetization direction of the second AMR R2 as a magnetization direction M20 pointing at the second direction D2; the second magnetization direction setting device M2 sets the magnetization direction of the third AMR R3 as a magnetization direction M30 pointing at the reverse direction of the second direction D2; the second magnetization direction setting device M2 sets a magnetization direction of the fourth AMR R4 as a magnetization direction M40 pointing at the second direction D2. Thereby, after the first timing, when the electric current I flows through the at least one conductive wire C, when the third contact P3' and the fourth contact P4' receives reference voltage VDD, and when the fifth contact P5' and the sixth contact P6' are grounded, the resistance variations of the first to the fourth AMRs R1, R2, R3, and R4 are +ΔR, −ΔR, −ΔR, and +ΔR, respectively; at this time, the voltage difference between the first contact P1' and the second contact P2' is (VDD)×(−ΔR/R) and can be an output signal, and the output signal is a differential signal whose value corresponds to the value of the magnetic field component HC and further corresponds to the amount of the electric current I flowing through the at least one conductive wire C. Similarly, at the second timing, when the first magnetization direction setting device M1 and the second magnetization direction setting device M2 sets the combination of the magnetization directions of the first to the fourth AMRs R1-R4 as being opposite to the combination depicted in FIG. 11, the voltage difference between the first contact P1' and the second contact P2' is (VDD)×(+ΔR/R).

According to the present embodiment, the first AMR R1 and the second AMR R2 are sequentially connected in series from the third contact P3' to the fifth contact P5', and the third AMR R3 and the fourth AMR R4 are sequentially connected in series from the fourth contact P4' to the sixth contact P6'. The first contact P1' is coupled to a conductive path between the first AMR R1 and the second AMR R2, and the second contact P2' is coupled to a conductive path between the third AMR R3 and the fourth AMR R4.

That is, in the present embodiment, the first AMR unit 222 and the second AMR unit 224 are electrically connected to form a Wheatstone bridge, so as to output the voltage signal corresponding to the resistance variations generated by the first AMR unit 222 and the second AMR unit 224.

Figure 12A:
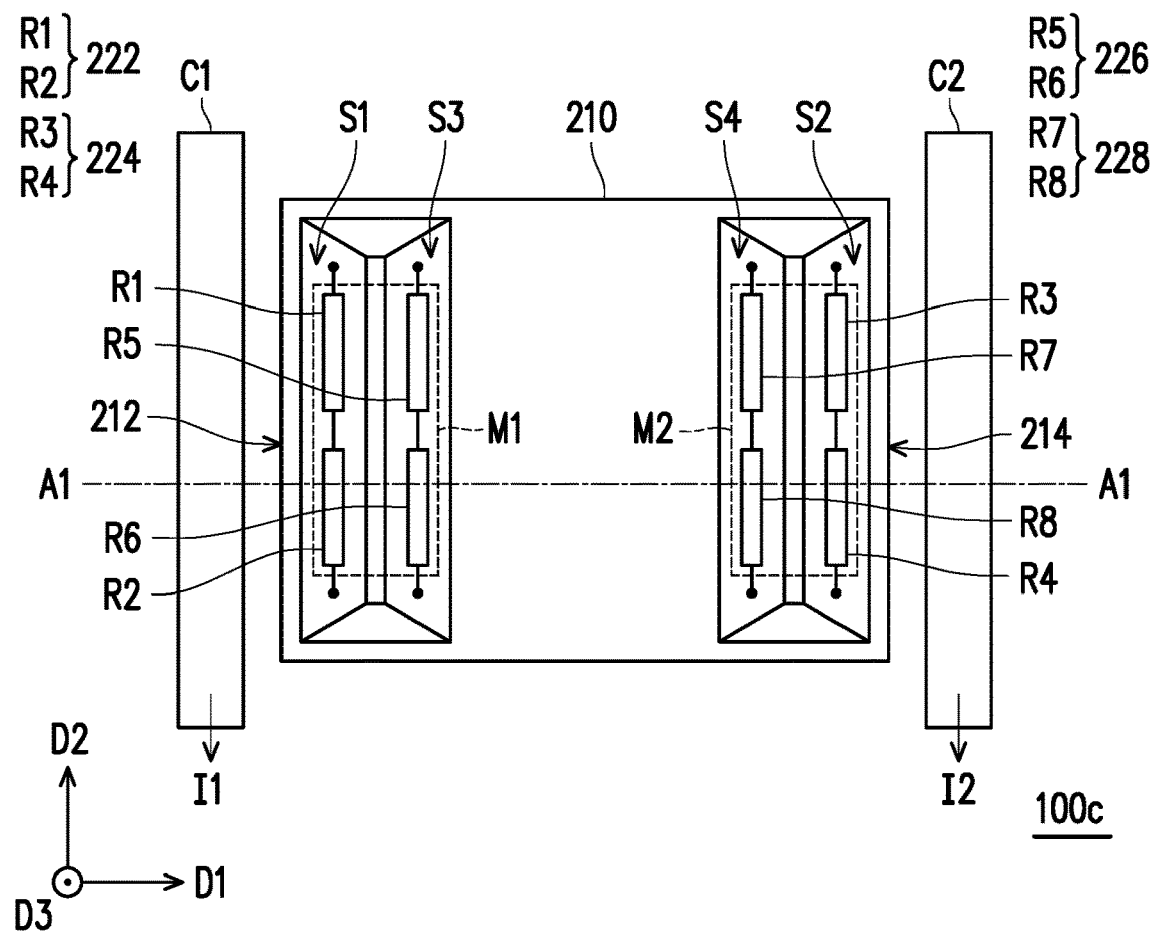
FIG. 12A is a schematic top view of an electric current sensor according to still another embodiment of the disclosure.
Figure 12B:
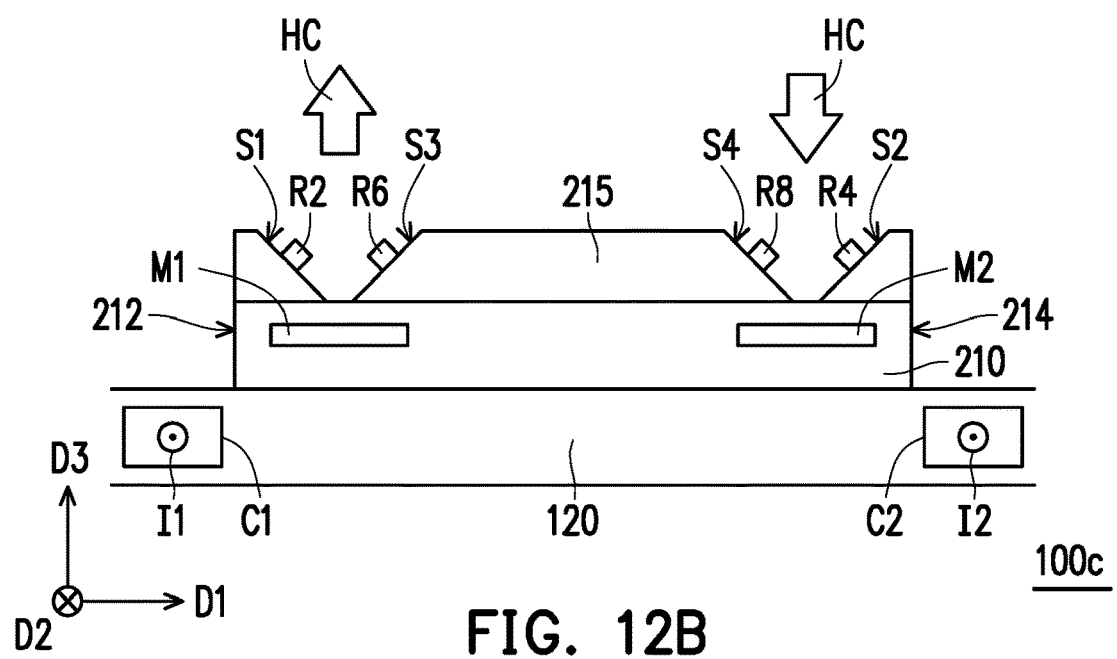
FIG. 12B is a schematic cross-sectional view illustrating the electric current sensor depicted in FIG. 12A along a line segment A1-A1.

FIG. 12A is a schematic top view of an electric current sensor according to still another embodiment of the disclosure, and FIG. 12B is a schematic cross-sectional view illustrating the electric current sensor depicted in FIG. 12A along a line segment A1-A1. With reference to FIG. 12A and FIG. 12B, the electric current sensor 100c provided in the embodiment is similar to the electric current sensor 100 depicted in FIG. 1 and FIG. 2, and the difference therebetween is described below. In the present embodiment, the electric current sensor 100c has two conductive wires C1 and C2 respectively disposed beside the first end 212 and the second end 214 of the substrate, wherein the first end 212 is opposite to the second end 214, and the two conductive wires C1 and C2 are not overlapped with the first end 212 and the second end 214, respectively. In the present embodiment, the conductive wires C1 and C2 both extend along the second direction D2. When electric currents I1 and I2 respectively flow through the conductive wire C1 and the conductive wire C2 along the reverse direction of the second direction D2, the electric current I1 generates a magnetic field component HC pointing at the third direction D3 at the first sloped surface S1 and the third sloped surface S3, and the electric current I2 generates a magnetic field component HC pointing at the reverse direction of the third direction D3 at the second sloped surface S2 and the fourth sloped surface S4. As such, the Wheatstone bridge constituted by connecting the first to the fourth AMR units 222, 224, 226, and 228 can output the voltage signal corresponding to the amount of the electric currents I1 and I2. In the present embodiment, the amount of the electric current I1 is equal to the amount of the electric current I2.

The number of the conductive wire in the electric current sensor 100c is not limited; in other embodiments, there may be more than two conductive wires in the electric current sensor 100c.

Figure 13A:
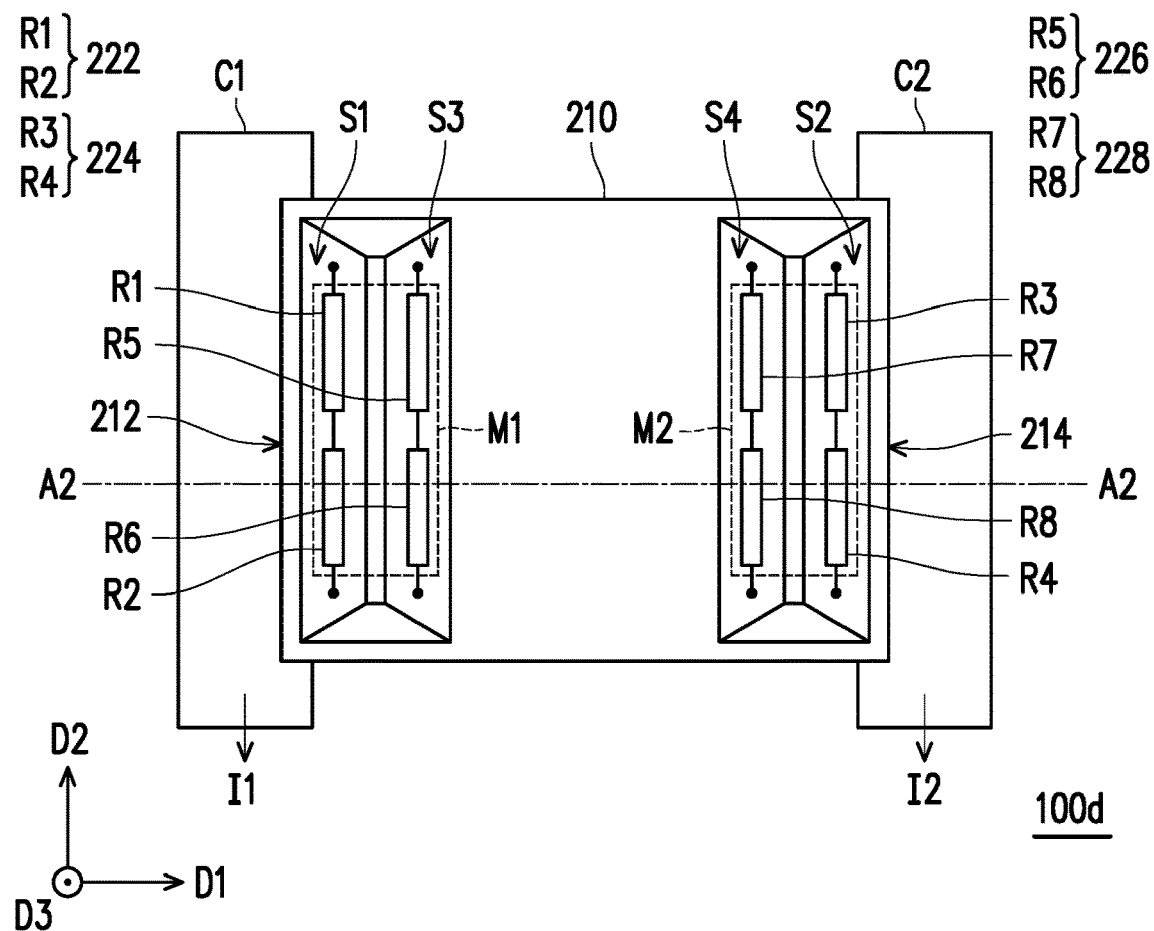
FIG. 13A is a schematic top view of an electric current sensor according to another embodiment of the disclosure.
Figure 13B:
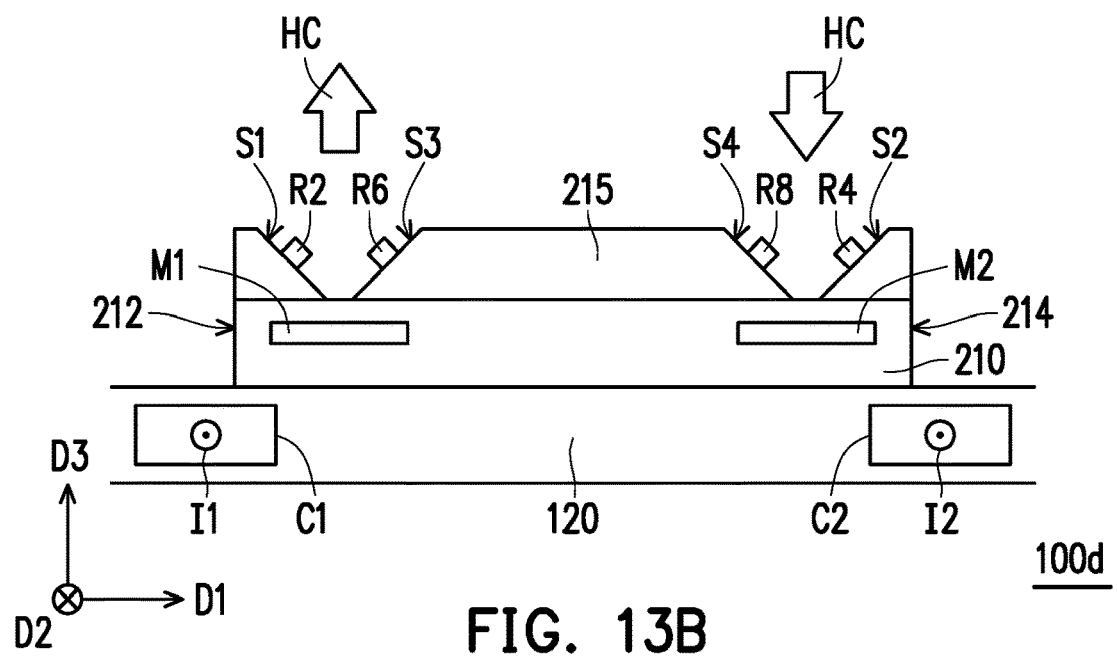
FIG. 13B is a schematic cross-sectional view illustrating the electric current sensor depicted in FIG. 13A along a line segment A2-A2.

FIG. 13A is a schematic top view of an electric current sensor according to another embodiment of the disclosure. FIG. 13B is a schematic cross-sectional view illustrating the electric current sensor depicted in FIG. 13A along a line segment A2-A2. With reference to FIG. 13A and FIG. 13B, the electric current sensor 100d provided in the embodiment is similar to the electric current sensor 100c depicted in FIG. 12A and FIG. 12B, and the difference therebetween is described as follows. In the electric current sensor 100d provided in the embodiment, the conductive wire C1 and the conductive wire C2 are respectively partially overlapped with the first end 212 and the second end 214 of the substrate 210; as such, the magnetic field component HC pointing at the third direction D3 can still be generated at the first sloped surface S1 and the third sloped surface S3, and the magnetic field component HC pointing at the reverse direction of the third direction D3 can still be generated at the second sloped surface S2 and the fourth sloped surface S4.

To sum up, in the electric current sensor provided in one or more embodiments of the disclosure, the AMR units are connected to form the Wheatstone bridge for sensing the magnetic field induced by the electric current in the conductive wire, and therefore the electric current sensing operation described herein is characterized by high sensitivity and high accuracy. Besides, the electric current sensor provided in one or more embodiments of the disclosure derives the amount of the electric current from the magnetic field induced by sensing the electric current, and the AMR units are not in direct contact with the electric current and thus consume less power.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An electric current sensor comprising:
a substrate;
a first sloped surface and a second sloped surface both disposed on the substrate and arranged in a first direction;
at least one conductive wire extending along a second direction and disposed beside the substrate;
a first anisotropic magnetoresistor unit disposed on the first sloped surface;
a second anisotropic magnetoresistor unit disposed on the second sloped surface;
a first magnetization direction setting device configured to set a magnetization direction of the first anisotropic magnetoresistor unit; and
a second magnetization direction setting device configured to set a magnetization direction of the second anisotropic magnetoresistor unit,
wherein when an electric current flows through the at least one conductive wire, a magnetic field component generated by the electric current on the first sloped surface in a third direction is opposite to a magnetic field component generated by the electric current on the second sloped surface in the third direction, the first direction, the second direction, and the third direction are different from one another, a sensing direction of the first anisotropic magnetoresistor unit and the second anisotropic magnetoresistor unit is inclined relative to the first direction and the third direction and is different from the second direction, the first anisotropic magnetoresistor unit and the second anisotropic magnetoresistor unit are electrically connected to output a voltage signal, and the voltage signal corresponds to the magnetic field components generated by the electric current on the first sloped surface and the second sloped surface in the third direction.

2. The electric current sensor according to claim 1, further comprising:
a third sloped surface and a fourth sloped surface both disposed on the substrate, wherein the third sloped surface and the first sloped surface are opposite to each other, the fourth sloped surface and the second sloped surface are opposite to each other, and the first sloped surface, the third sloped surface, the fourth sloped surface, and the second sloped surface are sequentially arranged in the first direction;
a third anisotropic magnetoresistor unit disposed on the third sloped surface, the first magnetization direction setting device also being configured to set a magnetization direction of the third anisotropic magnetoresistor unit; and
a fourth anisotropic magnetoresistor unit disposed on the fourth sloped surface, the second magnetization direction setting device also being configured to set a magnetization direction of the fourth anisotropic magnetoresistor unit, wherein when the electric current flows through the at least one conductive wire, since a magnetic field is induced by the electric current, resistance variations generated by the first anisotropic magnetoresistor unit are opposite to resistance variations generated by the third anisotropic magnetoresistor unit, resistance variations generated by the second anisotropic magnetoresistor unit are opposite to resistance variations generated by the fourth anisotropic magnetoresistor unit, and the first, the second, the third, and the fourth anisotropic magnetoresistor units are electrically connected to form a Wheatstone bridge to output voltage signals corresponding to the resistance variations generated by the first, the second, the third, and the fourth anisotropic magnetoresistor units.

3. The electric current sensor according to claim 2, further comprising an operator electrically connected to an output terminal of the Wheatstone bridge, wherein the first magnetization direction setting device and the second magnetization direction setting device set a combination of the magnetization directions of the first, the second, the third, and the fourth anisotropic magnetoresistor units as a first combination to allow the Wheatstone bridge to subsequently output a first voltage signal, and the first magnetization direction setting device and the second magnetization direction setting device set a combination of the magnetization directions of the first, the second, the third, and the fourth anisotropic magnetoresistor units as a second combination opposite to the first combination to allow the Wheatstone bridge to subsequently output a second voltage signal, wherein the operator is configured to subtract the second voltage signal from the first voltage signal or subtract the first voltage signal from the second voltage signal to output an output voltage signal corresponding to a magnitude of the magnetic field induced by the electric current.

4. The electric current sensor according to claim 3, wherein the operator is configured to add the first voltage signal and the second voltage signal to output an offset voltage signal.

5. The electric current sensor according to claim 2, wherein an output voltage signal of the Wheatstone bridge corresponding to an external magnetic field component in the first direction, in the second direction, and in the third direction is zero, respectively.

6. The electric current sensor according to claim 2, wherein the first anisotropic magnetoresistor unit comprises a first anisotropic magnetoresistor and a second anisotropic magnetoresistor sequentially arranged along a reverse direction of the second direction, the second anisotropic magnetoresistor unit comprises a third anisotropic magnetoresistor and a fourth anisotropic magnetoresistor sequentially arranged along the reverse direction of the second direction, the third anisotropic magnetoresistor unit comprises a fifth anisotropic magnetoresistor and a sixth anisotropic magnetoresistor sequentially arranged along the reverse direction of the second direction, and the fourth anisotropic magnetoresistor unit comprises a seventh anisotropic magnetoresistor and an eighth anisotropic magnetoresistor sequentially arranged along the reverse direction of the second direction.

7. The electric current sensor according to claim 6, wherein at a first timing, the first magnetization direction setting device sets magnetization directions of the first anisotropic magnetoresistor and the fifth anisotropic magnetoresistor as the reverse direction of the second direction and sets magnetization directions of the second anisotropic magnetoresistor and the sixth anisotropic magnetoresistor as the second direction; at the first timing, the second magnetization direction setting device sets magnetization directions of the third anisotropic magnetoresistor and the seventh anisotropic magnetoresistor as the reverse direction of the second direction and sets magnetization directions of the fourth anisotropic magnetoresistor and the eighth anisotropic magnetoresistor as the second direction; at a second timing, the first magnetization direction setting device sets the magnetization directions of the first anisotropic magnetoresistor and the fifth anisotropic magnetoresistor as the second direction and sets the magnetization directions of the second anisotropic magnetoresistor and the sixth anisotropic magnetoresistor as the reverse direction of the second direction; at the second timing, the second magnetization direction setting device sets the magnetization directions of the third anisotropic magnetoresistor and the seventh anisotropic magnetoresistor as the second direction and sets the magnetization directions of the fourth anisotropic magnetoresistor and the eighth anisotropic magnetoresistor as the reverse direction of the second direction.

8. The electric current sensor according to claim 1, wherein the first magnetization direction setting device and the second magnetization direction setting device are conductive sheets, conductive coils, conductive wires, conductors, or permanent magnets.

9. The electric current sensor according to claim 1, wherein the first direction, the second direction, and the third direction are perpendicular to one another.

10. The electric current sensor according to claim 1, wherein the number of the at least one conductive wire is one, the first sloped surface and the second sloped surface are located on a first side of the substrate, the conductive wire is located on a second side of the substrate, and the first side is opposite to the second side.

11. The electric current sensor according to claim 10, wherein the first sloped surface and the second sloped surface are respectively located beside two opposite ends of the substrate, and the conductive wire is located beside a center of the substrate.

12. The electric current sensor according to claim 1, wherein the number of the at least one conductive wire is two, the two conductive wires are respectively disposed beside a first end and a second end of the substrate, the first end is opposite to the second end, and the two conductive wires are partially overlapped with the first end and the second end, respectively.

13. The electric current sensor according to claim 1, wherein the number of the at least one conductive wire is two, the two conductive wires are respectively disposed beside a first end and a second end of the substrate, the first end is opposite to the second end, and the two conductive wires are not overlapped with the first end and the second end, respectively.

14. The electric current sensor according to claim 1, wherein the first anisotropic magnetoresistor unit and the second anisotropic magnetoresistor unit are electrically connected to form a Wheatstone bridge, so as to output voltage signals corresponding to resistance variations generated by the first anisotropic magnetoresistor unit and the second anisotropic magnetoresistor unit.

* * * * *